(12) United States Patent
Lee et al.

(10) Patent No.: US 10,002,850 B2
(45) Date of Patent: Jun. 19, 2018

(54) SEMICONDUCTOR CHIP FLEXIBLY APPLIED TO VARIOUS ROUTING STRUCTURES AND SEMICONDUCTOR CHIP MODULE USING THE SAME

(71) Applicant: SK hynix Inc., Icheon-si, Gyeonggi-do (KR)

(72) Inventors: Sang Eun Lee, Icheon-si (KR); Eun Ko, Seoul (KR); Yong Jae Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/221,920

(22) Filed: Jul. 28, 2016

(65) Prior Publication Data

US 2017/0317056 A1  Nov. 2, 2017

(30) Foreign Application Priority Data

Apr. 28, 2016  (KR) .......................... 10-2016-0051909

(51) Int. Cl.
| | |
|---|---|
| *H01L 23/48* | (2006.01) |
| *H01L 23/52* | (2006.01) |
| *H01L 29/40* | (2006.01) |
| *H01L 25/065* | (2006.01) |
| *H01L 23/498* | (2006.01) |
| *H01L 23/00* | (2006.01) |

(52) U.S. Cl.
CPC .... *H01L 25/0657* (2013.01); *H01L 23/49827* (2013.01); *H01L 24/14* (2013.01); *H01L 2224/14104* (2013.01); *H01L 2225/06513* (2013.01); *H01L 2225/06544* (2013.01)

(58) Field of Classification Search
CPC .......... H01L 25/0657; H01L 23/49827; H01L 24/14; H01L 2225/06544; H01L 2224/14104; H01L 2225/06513
See application file for complete search history.

(56) References Cited

U.S. PATENT DOCUMENTS

| | | | |
|---|---|---|---|
| 8,569,886 B2* | 10/2013 | Tu ........................... | H01L 24/05 257/773 |
| 8,711,573 B2 | 4/2014 | Gillingham | |
| 9,111,936 B2* | 8/2015 | Law ..................... | H01L 23/481 |
| 2016/0093606 A1* | 3/2016 | Chen .................... | H01L 23/552 361/57 |

* cited by examiner

*Primary Examiner* — Stephen W Smoot
*Assistant Examiner* — Vicki B Booker
(74) *Attorney, Agent, or Firm* — William Park & Associates Ltd.

(57) ABSTRACT

A semiconductor chip may include a semiconductor substrate having a front surface and a rear surface which faces away from the front surface. The semiconductor chip may include a fixed metal layer formed over the front surface of the semiconductor substrate, and having first metal lines formed in the fixed metal layer. The semiconductor chip may include a configurable metal layer formed over the fixed metal layer to have one surface which faces the fixed metal layer and the other surface which faces away from the one surface, and having second metal lines formed in the configurable metal layer such that at least one end of the second metal lines disposed on the one surface are respectively connected with the first metal lines and other ends of the second metal lines facing away from the at least one end are disposed at predetermined positions on the other surface.

16 Claims, 8 Drawing Sheets

SEMICONDUCTOR CHIP FLEXIBLY APPLIED TO VARIOUS ROUTING STRUCTURES AND SEMICONDUCTOR CHIP MODULE USING THE SAME

CROSS-REFERENCE TO RELATED APPLICATION

The present application claims priority under 35 U.S.C. § 119(a) to Korean Patent Application No. 10-2016-0051909 filed on Apr. 28, 2016, in the Korean Intellectual Property Office, which is incorporated herein by reference in its entirety.

BACKGROUND

1. Technical Field

Various embodiments generally relate to a semiconductor package, and more particularly, to a semiconductor chip which may be flexibly applied to various routing structures and a stacked semiconductor chip using the same.

2. Related Art

In the semiconductor industry, packaging technologies for integrated circuits have continuously been developed to satisfy the demand toward miniaturization and mounting reliability. Recently, as miniaturization and high performance are demanded in electric and electronic appliances, various stacking techniques have been developed.

The term "stack", that is referred to in packaging technologies, means to vertically pile at least two semiconductor chips or semiconductor packages. In the case of a memory device, by using a stacking technology, it is possible to realize a product having storage capacity at least two times greater than that obtainable through semiconductor integration processes.

Stacked packages have advantages in terms of not only storage capacity but also mounting density and mounting area utilization efficiency, and thus, research and development for stacked packages have been accelerated.

As an example of stacked packages, a stack package in which semiconductor chips having TSVs (through-silicon vias) are stacked up and down using bumps has been disclosed in the art. In such a stack package, because signal transfer between upper and lower semiconductor chips is implemented through vertical input/output lines formed by the TSVs and the bumps, a high operation speed may be achieved and miniaturization is made possible.

Meanwhile, in the stack package using the TSVs, various wiring structures for routing may be formed in the circuit layers of the respective semiconductor chips.

SUMMARY

In an embodiment, a semiconductor chip may include a semiconductor substrate having a front surface and a rear surface which faces away from the front surface. The semiconductor chip may include a fixed metal layer formed over the front surface of the semiconductor substrate, and having first metal lines which are formed in the fixed metal layer. The semiconductor chip may include a configurable metal layer formed over the fixed metal layer to have one surface which faces the fixed metal layer and an other surface which faces away from the one surface, and having second metal lines which are formed in the configurable metal layer such that at least one end of the second metal lines disposed on the one surface are respectively connected with the first metal lines and other ends of the second metal lines facing away from at least one end are disposed at predetermined positions on the other surface.

In an embodiment, a semiconductor chip module may include a semiconductor chip including a semiconductor substrate having a front surface and a rear surface which faces away from the front surface, a fixed metal layer formed over the front surface of the semiconductor substrate, and having first metal lines which are formed in the fixed metal layer, and a configurable metal layer formed over the fixed metal layer to have one surface which faces the fixed metal layer and an other surface which faces away from the one surface, and having second metal lines which are formed in the configurable metal layer such that at least one end of the second metal lines disposed on the one surface are respectively connected with the first metal lines and the other ends of the second metal lines facing away from the at least one end are disposed at predetermined positions on the other surface. The stacked semiconductor chip module may include one or more additional semiconductor chips stacked over the semiconductor chip, and each having the same structure as the semiconductor chip. The stacked semiconductor chip may include connection members interposed between the semiconductor chip and a lowermost additional semiconductor chip and between the stacked additional semiconductor chips, and physically and electrically connecting the semiconductor chip and the additional semiconductor chips.

DETAILED DESCRIPTION

Various embodiments may relate to a semiconductor chip which may be flexibly applied to various routing structures, and a stacked semiconductor chip using the same.

Hereinafter, a semiconductor chip and a stacked semiconductor chip using the same will be described below with reference to the accompanying drawings through various example embodiments.

Figure 1:
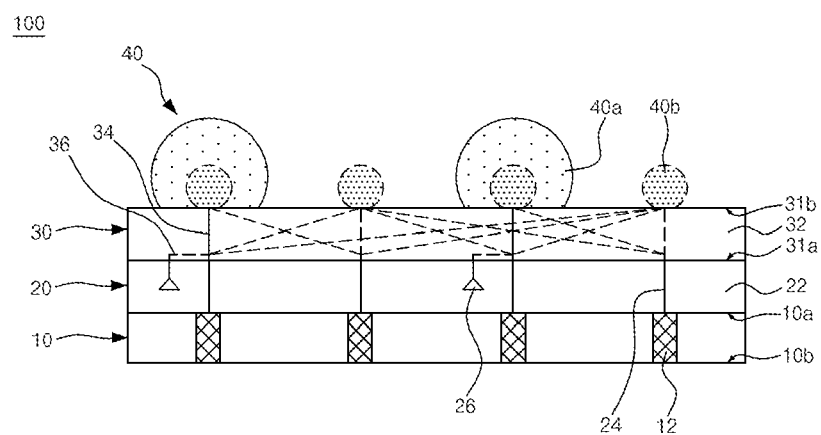
FIG. 1 is a cross-sectional view illustrating a representation of an example of a semiconductor chip in accordance with an embodiment.

Referring to FIG. 1, a semiconductor chip 100 in accordance with an embodiment may include a semiconductor substrate 10, a fixed metal layer 20, and a configurable metal layer 30. The semiconductor chip 100 in accordance with an embodiment may also include a plurality of external connection members 40.

The semiconductor substrate 10 may be made of silicon. The semiconductor substrate 10 may have a front surface 10a and a rear surface 10b which faces away from the front surface 10a, and may possess a quadrangular plate shape. The semiconductor substrate 10 may include therein a plurality of TSVs 12 which are formed to pass through the front surface 10a and the rear surface 10b. The TSVs 12 may be formed as an electrical connection means between overlying and underlying semiconductor chips when manufacturing a stacked package.

The fixed metal layer 20 may be formed over the front surface 10a of the semiconductor substrate 10. The fixed metal layer 20 may include a first dielectric layer 22 and first metal lines 24 formed in the fixed metal layer 20. The first metal lines 24 may be formed in such a manner that at least one end thereof is connected with the TSVs 12 formed in the semiconductor substrate 10 and the other end facing away from the at least one end reaches the configurable metal layer 30. For example, the first metal lines 24 may be formed in shapes of vertical lines which are connected with the TSVs 12 arranged on the same vertical lines as the first metal lines 24.

While not shown in detail, the fixed metal layer 20 may have a multi-layered metal line structure including at least two layers each including the first dielectric layer 22 and the first metal lines 24. The fixed metal layer 20 having such a multi-layered metal line structure may include various functional logics which are formed according to a chip design. That is to say, the fixed metal layer 20 may include circuits included in a dynamic random access memory (DRAM) chip, for example, circuits performing most DRAM functions, such as sense amplifiers, local input/output (LIO), global input/output (GIO) and drivers.

The fixed metal layer 20 may include I/O buffers 26 formed therein. The I/O buffers 26 may act as interface circuits which connect the TSVs 12 and circuits or electrical contacts of an integrated circuit for electrical connection of the I/O buffers 26 and at least some of the TSVs 12 via at least some second metal lines 34 of the configurable metal layer 30.

The configurable metal layer 30 may allow one chip design to be flexibly adapted for various configurations and packages to which flip chip bumps and micro bumps are applied. The configurable metal layer 30 may be additionally formed over the fixed metal layer 20 at a chip level. In other words, in the present embodiment, the configurable metal layer 30 may be additionally formed over the fixed metal layer 20 to realize various routings, after the fixed metal layer 20 of the multi-layered metal line structure is formed to include various functional logics according to a chip design, in a semiconductor manufacturing process.

The configurable metal layer 30 may have one surface 31a which faces the fixed metal layer 20 and an other surface 31b which faces away from the one surface 31a. The configurable metal layer 30 may include a second dielectric layer 32 and second metal lines 34 which are formed in the configurable metal layer 30 of the second dielectric layer 32. The second metal lines 34 may be formed for routings. The second metal lines 34 may be formed such that each of the at least one end of the second metal lines 34 is selectively connected with any one of the first metal lines 24 of the fixed metal layer 20, and the other ends of the second metal lines 34 facing away from the at least one end are disposed at predetermined positions on the other surface 31b of the configurable metal layer 30. The configurable metal layer 30 may further include connection lines 36 formed therein to connect the I/O buffers 26 and the second metal lines 34.

In FIG. 1, the routings, that is, the second metal lines 34, shown by the dashed lines in the configurable metal layer 30, in some embodiments are not actually formed or are not formed with their paths, but are illustrated to explain that any one of various routings may be formed. Therefore, the second metal lines 34 of the configurable metal layer 30 may be appropriately formed by being optimized for the configuration of a system to which a corresponding chip is to be applied.

For example, in the present embodiment, when four first metal lines 24 connected with the TSVs 12 form one group, the configurable metal layer 30 may be formed to have any one among the following routing structures.

Figure 2A:
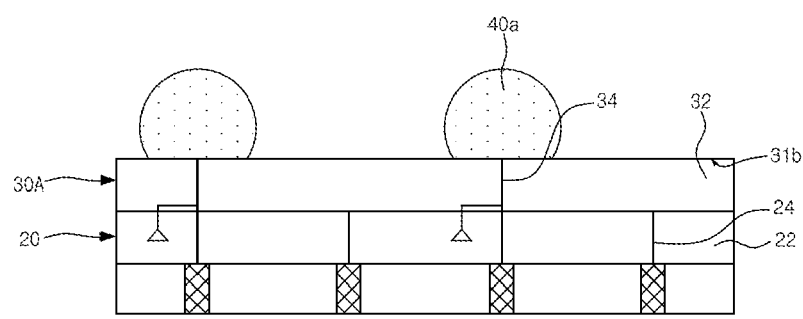
FIGS. 2A to 2D are representations of examples of cross-sectional views to assist in an explanation of examples of a configurable metal layer in the semiconductor chip according to an embodiment.

Referring to FIG. 2A, a configurable metal layer 30A may be formed in such a manner that second metal lines 34 are connected with only the first metal lines 24 positioned first and third when viewed in a cross-section from the left end and the second metal lines 34 reach the other surface 31b by extending vertically. The configurable metal layer 30A having such a routing structure may be advantageously applied to the manufacture of a package having a flip chip bump structure which has a large bump pitch.

Figure 2B:
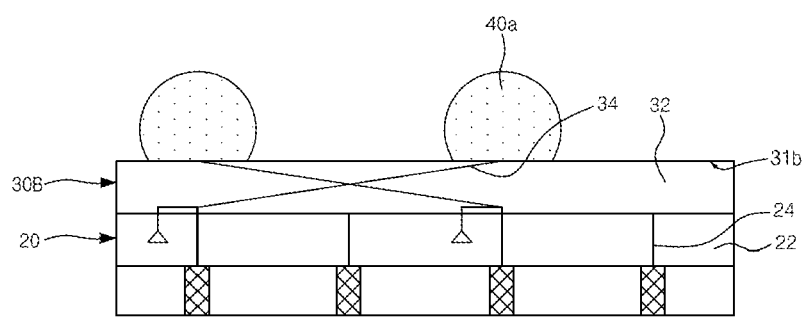

Referring to FIG. 2B, a configurable metal layer 30B may be formed in such a manner that second metal lines 34 are connected with only the first metal lines 24 positioned first and third when viewed on a cross-section from the left end and reach the other surface 31b by extending to cross each other. The configurable metal layer 30B having such a routing structure may be applied to the manufacture of a package having a flip chip bump structure, in the same manner as in FIG. 2A.

In FIGS. 2A and 2B, the reference symbol 40a designates solder bumps which are formed on the other ends of the second metal lines 34 disposed on the other surface 31b of each of the configurable metal layers 30A and 30B.

Figure 2C:
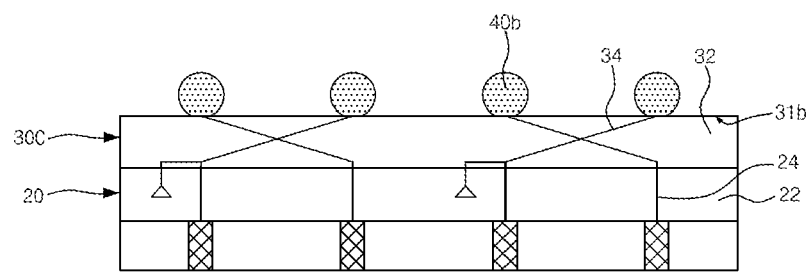

Referring to FIG. 2C, a configurable metal layer 30C may be formed in such a manner that the second metal lines 34 are connected with all the first metal lines 24 respectively corresponding thereto, two second metal lines 34 are connected with the first metal lines 24 positioned first and second when viewed in a cross-section from the left end and reach the other surface 31b by crossing each other, and the other two second metal lines 34 are connected with the first metal lines 24 positioned third and fourth when viewed in the cross-section from the left end and reach the other surface 31b by crossing each other. The configurable metal layer 30C having such a routing structure may be applied to a manufacture of a package having a micro bump structure which has a fine bump pitch.

The second metal lines 34 which are connected with the first metal lines 24 positioned first and second when viewed from the left end are formed to cross each other when viewed in the cross-section, and the second metal lines 34 which are connected with the first metal lines 24 positioned third and fourth when viewed from the left end are formed to cross each other when viewed in the cross-section. While not shown, the second metal lines 34 which are connected with the first metal lines 24 positioned first and second when viewed from the left end are formed to not be short-circuited with each other when viewed three-dimensionally, and the second metal lines 34 which are connected with the first metal lines 24 positioned third and fourth when viewed from the left end are formed to not be short-circuited with each other when viewed three-dimensionally.

Figure 2D:
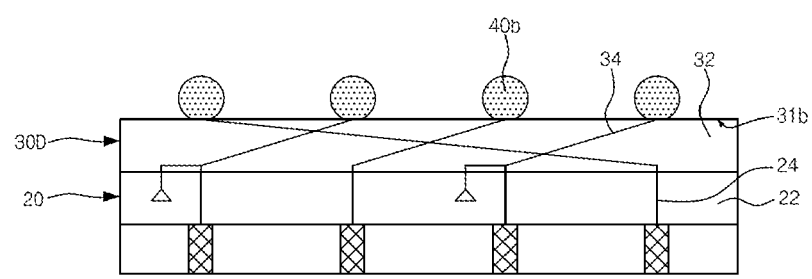

Referring to FIG. 2D, a configurable metal layer 30D may be formed in such a manner that the second metal lines 34 are connected with all the first metal lines 24 respectively corresponding thereto while having oblique line shapes, that three second metal lines 34 positioned second, third and fourth when viewed from the left end have at least one end which is respectively connected with the first metal lines 24 positioned first, second and third when viewed in a cross-section from the left end and the other ends which are arranged on the same vertical lines as the first metal lines 24 positioned second, third and fourth, and that the second metal line 34 connected with the first metal line 24 positioned fourth is vertically aligned with the first metal line 24 positioned first. While the second metal line 34 connected with the first metal line 24 positioned fourth crosses the remaining second metal lines 34 when viewed in the cross-section, the second metal line 34 connected with the first metal line 24 positioned fourth is formed to not be short-circuited with the remaining second metal lines 34 when viewed three-dimensionally. The configurable metal layer 30D having such a routing structure may be applied to a manufacture of a package having a micro bump structure which has a fine bump pitch, in the same manner as in FIG. 2C.

In FIGS. 2C and 2D, the reference symbol 40b designates micro bumps which may be formed on the other ends of the second metal lines 34 disposed on the other surface 31b of each of the configurable metal layers 30C and 30D.

Referring again to FIG. 1, the external connection members 40 as means for mounting the semiconductor chip 100 in accordance with an embodiment to a printed circuit board, etc. may include the solder bumps 40a or the micro bumps 40b. The solder bumps 40a may be applied when a pad pitch is wide, and, conversely, the micro bumps 40b may be applied when a pad pitch is fine. For example, when only active I/Os are connected, since a pad pitch interval does not exist, the solder bumps 40a may be applied. Conversely, when not only active I/Os but also dummy I/Os form connections, the micro bumps 40b may be applied for a fine pitch connection.

In FIG. 1, the external connection members 40 shown by the solid lines are the solder bumps 40a, and the external connection members 40 shown by the dotted lines are the micro bumps 40b. The solder bumps 40a and the micro bumps 40b are not formed together. Both the solder bumps 40a and the micro bumps 40b are shown in the drawing for the sake of easy understanding of the present embodiment. It is to be noted that any one of the solder bumps 40a and the micro bumps 40b may be selectively formed.

As described above, in the semiconductor chip according to an embodiment, by manufacturing a semiconductor chip according to a developed chip design and then additionally forming a configurable metal layer for routing, it is possible to solve a problem caused by a metal line structure for routing that is fixed in conformity with a chip design and is difficult to be flexibly applied to various structures.

Namely, in a semiconductor chip according to an embodiment, an uppermost metal layer for routing may be applied by being designed differently according to the configuration of a die at a chip level. Accordingly, in a semiconductor chip according to an embodiment, one chip design may be flexibly applied to various configurations, that is, packages each of which adopts flip chip bumps or micro bumps.

A semiconductor chip according to the above-described various embodiments may be applied to semiconductor chip modules used for manufacturing stacked packages.

Figure 3:
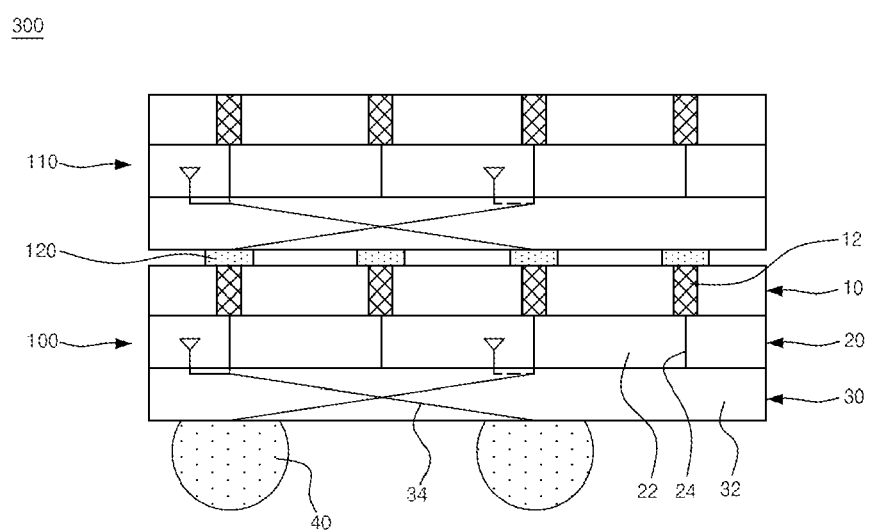
FIGS. 3 and 4 are cross-sectional views illustrating representations of examples of a semiconductor chip module realized using semiconductor chips according to an embodiment.
Figure 4:
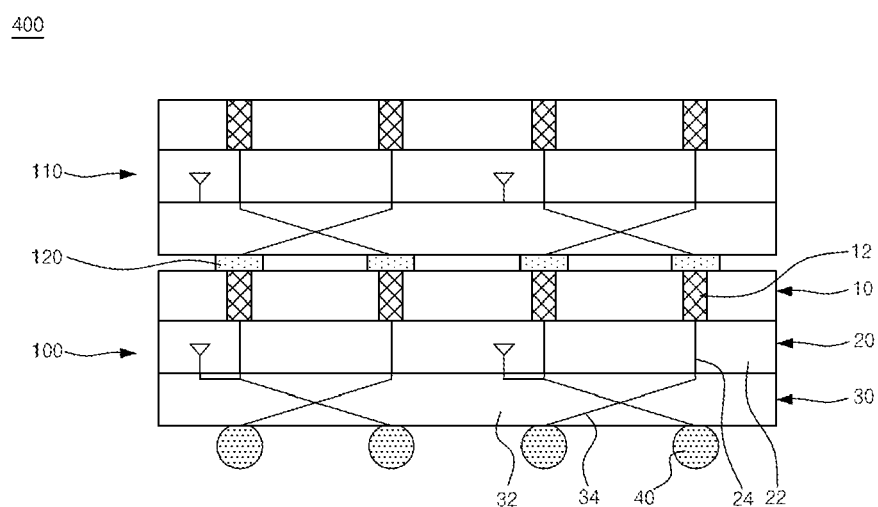

Referring to FIGS. 3 and 4, each of semiconductor chip modules 300 and 400 in accordance with embodiments may include a semiconductor chip 100, an additional semiconductor chip 110, and connection members 120.

The semiconductor chip 100 may include a semiconductor substrate 10, a fixed metal layer 20, a configurable metal layer 30, and external connection members 40.

The semiconductor substrate 10 may be made of silicon. The semiconductor substrate 10 may include therein a plurality of TSVs 12 which is formed to pass through the front surface and the rear surface of the semiconductor substrate 10.

The fixed metal layer 20 may include a first dielectric layer 22 and first metal lines 24. While not shown in detail, the fixed metal layer 20 may have a multi-layered metal line structure including at least two layers each including the first dielectric layer 22 and the first metal lines 24. The fixed metal layer 20 having the multi-layered metal line structure may include various functional logics which are formed according to a chip design.

The configurable metal layer 30 may be additionally formed on the fixed metal layer 20 at a chip level to realize various routings. The configurable metal layer 30 may include a second dielectric layer 32 and second metal lines 34. The second metal lines 34 may be formed in such a manner that at least one end of each second metal line 34 is connected with all of the first metal lines 24 of the fixed metal layer 20, or each second metal line 34 is selectively connected with some of the first metal lines 24 of the fixed metal layer 20 and the other ends of the second metal lines 34 are disposed at various positions on the other surface of the configurable metal layer 30 to conform to a corresponding system.

For example, as shown in FIG. 3, the second metal lines 34 may be formed in such a manner that at least one end thereof is selectively connected with only the first metal lines 24 positioned first and third when viewed from the left end of the fixed metal layer 20 and the other end thereof is disposed on the other surface of the configurable metal layer 30 after the second metal lines 34 extend in such a way as to cross each other. Conversely, as shown in FIG. 4, the second metal lines 34 may be formed in such a manner that the second metal lines 34 are connected with all of the first metal lines 24 of the fixed metal layer 20, two second metal lines 34 are connected with the first metal lines 24 positioned first and second when viewed from the left end and reach the other surface of the configurable metal layer 30 by crossing each other, and the other two second metal lines 34 are connected with the first metal lines 24 positioned third and fourth when viewed from the left end and reach the other surface of the configurable metal layer 30 by crossing each other.

The external connection members 40 may be formed on the other surface of the configurable metal layer 30 which includes the other ends of the second metal lines 34. For example, as shown in FIG. 3, solder bumps may be applied as the external connection members 40 to conform to the case where only active I/Os are connected. Conversely, as shown in FIG. 4, micro bumps may be applied as the external connection members 40 to conform to the case where active I/Os and dummy I/Os are connected.

The additional semiconductor chip 110 may be provided to have substantially the same configuration as the above-described semiconductor chip 100, except for the external connection members 40. That is to say, the additional semiconductor chip 110 may be provided into a structure including a semiconductor substrate 10 which has a plurality of TSVs 12, a fixed metal layer 20 which is formed on the front surface of the semiconductor substrate 10, where the fixed metal layer 20 includes first metal lines 24 and has functional logics, and a configurable metal layer 30 which is formed on the fixed metal layer 20 and includes second metal lines 34 for routings.

Meanwhile, in the additional semiconductor chip 110, formation of the TSVs 12 in the semiconductor substrate 10 may be omitted.

The connection members 120 may be formed to physically connect the underlying semiconductor chip 100 and the overlying additional semiconductor chip 110, and the connection members 120 may electrically connect the TSVs 12 of the semiconductor chip 100 and the second metal lines 34 of the additional semiconductor chip 110. The connection members 120 may include solders.

While not shown, each of the semiconductor chip modules 300 and 400 in accordance with embodiments may further include an underfill which is filled in the space between the semiconductor chip 100 and the additional semiconductor chip 110.

Figure 5:
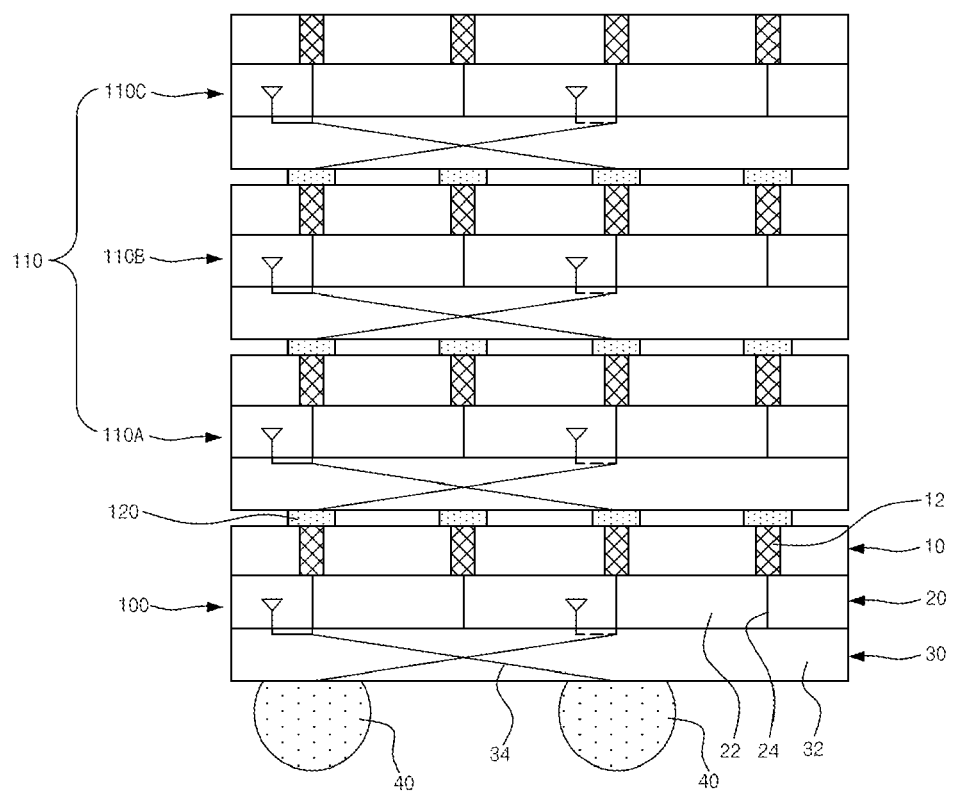
FIGS. 5 and 6 are cross-sectional views illustrating representations of examples of a semiconductor chip module realized using semiconductor chips according to an embodiment.
Figure 6:
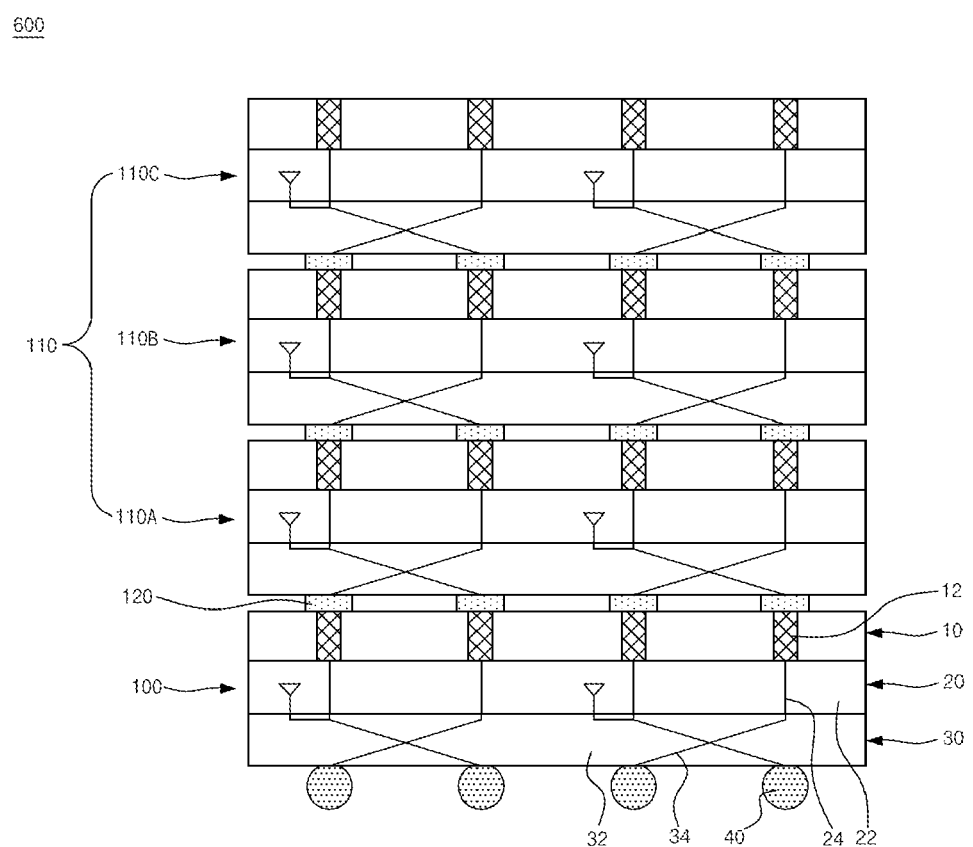

Referring to FIGS. 5 and 6, each semiconductor chip module 500 and 600 in accordance with embodiments may include a semiconductor chip 100, three additional semiconductor chips 110A, 110B and 110C, and connection members 120.

The semiconductor chip 100 may include a semiconductor substrate 10, a fixed metal layer 20, a configurable metal layer 30, and external connection members 40. The semiconductor substrate 10 may include a plurality of TSVs 12 which are formed to pass through a front surface and the rear surface of the semiconductor substrate 10. The fixed metal layer 20 may include a first dielectric layer 22 and first metal lines 24. While not shown in detail, the fixed metal layer 20 may have a multi-layered metal line structure including at least two layers each including the first dielectric layer 22 and the first metal lines 24, and may include various functional logics which are formed according to a chip design.

The configurable metal layer 30 may be additionally formed on the fixed metal layer 20 at a chip level. The configurable metal layer 30 may include a second dielectric layer 32 and second metal lines 34. The second metal lines 34 may be formed in such a manner that at least one end of the second metal lines 34 is connected with all of the first metal lines 24 of the fixed metal layer 20 or are selectively connected with some of the first metal lines 24 of the fixed metal layer 20, and the other ends of the second metal lines 34 are disposed at various positions on the other surface of the configurable metal layer 30 to conform to a corresponding system.

For example, as shown in FIG. 5, the second metal lines 34 may be formed in such a manner that at least one end of the second metal lines 34 is selectively connected with only the first metal lines 24 positioned first and third when viewed from the left end of the fixed metal layer 20 and the other ends of the second metal lines 34 are disposed on the other surface of the configurable metal layer 30 after the second metal lines 34 extend in such a way as to cross each other. Conversely, as shown in FIG. 6, the second metal lines 34 may be formed in such a manner that they are connected with all of the first metal lines 24 of the fixed metal layer 20, two second metal lines 34 may be connected with the first metal lines 24 positioned first and second when viewed from the left end and reach the other surface of the configurable metal layer 30 by crossing each other, and the other two second metal lines 34 may be connected with the first metal lines 24 positioned third and fourth when viewed from the left end and reach the other surface of the configurable metal layer 30 by crossing each other.

The external connection terminals 40 may be formed on the other surface of the configurable metal layer 30 which includes the other ends of the second metal lines 34. As shown in FIG. 5, solder bumps may be applied as the external connection members 40 in the case where only active I/O is connected. Unlike this, as shown in FIG. 6, micro bumps may be applied as the external connection members 40 in the case where active I/O and dummy I/O are connected.

In one embodiment, one or more additional semiconductor chips 110A, 110B, and 110C may be stacked over the semiconductor chip 100. Each of the three additional semiconductor chips 110A, 110B and 110C may be provided to have substantially the same configuration and structure as the above-described semiconductor chip 100, except that in some embodiments, the additional semiconductor chips 110A, 110B, and 110C do not have the external connection members 40. That is to say, each of the three additional semiconductor chips 110A, 110B and 110C may be provided into a structure including a semiconductor substrate 10 which has a plurality of TSVs 12, a fixed metal layer 20 which includes first metal lines 24 and has functional logics, and a configurable metal layer 30 which includes second metal lines 34 for routings.

Meanwhile, in an uppermost additional semiconductor chip 110C disposed uppermost among the three additional semiconductor chips 110A, 110B and 110C, formation of the TSVs 12 in the semiconductor substrate 10 may be omitted.

The connection members 120 may be formed to physically connect the underlying semiconductor chip 100 with the overlying additional semiconductor chip 110A and the stacked additional semiconductor chips 110A, 110B, and 110C with one another by being interposed therebetween, and the connection members 120 may physically and electrically connect the TSVs 12 of the underlying semiconductor chip 100 with the second metal lines 34 of the lowermost additional semiconductor chip 110A and the TSVs 12 and the second metal lines 34 of the stacked additional semiconductor chips 110B and 110C with one another. The connection members 120 may include solders.

While not shown, each of the semiconductor chip modules 500 and 600 in accordance with embodiments may further include underfills which are filled between the spaces between the semiconductor chip 100 and the additional semiconductor chip 110A and between the stacked additional semiconductor chips 110A, 110B and 110C.

In the meantime, while it was illustrated and described in the above embodiments, for the sake of convenience in explanation, that two or four semiconductor chips and additional semiconductor chips are stacked, it is to be noted that the technical concept of the present disclosure may be applied to a case where the number of stacked semiconductor chips and additional semiconductor chips is at least three or five.

The semiconductor chips in accordance with the above-described various embodiments may be applied to various kinds of electronic systems and memory cards.

Figure 7:
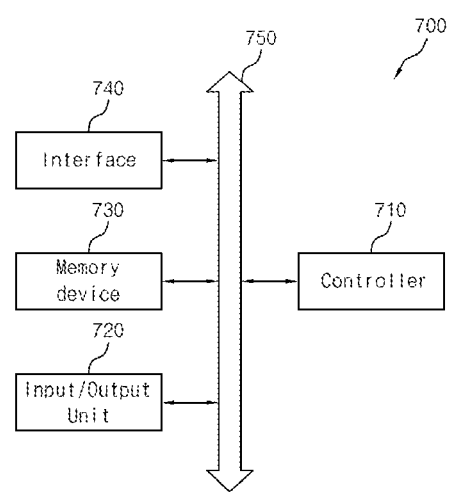
FIG. 7 is a block diagram representation of an example of an electronic system to which a semiconductor chip in accordance with embodiments is applied.

Referring to FIG. 7, an electronic system 700 may include semiconductor chips in accordance with the various embodiments. The electronic system 700 may include a controller 710, an input/output unit 720, and a memory device 730. The controller 710, the input/output unit 720 and the memory device 730 may be coupled with one another through a bus 750 which provides data movement paths.

For example, the controller 710 may include at least any one of a microprocessor, a digital signal processor, a microcontroller, and logic devices capable of performing similar functions to these components. The controller 710 and the memory device 730 may include the semiconductor chips in accordance with the various embodiments. The input/output unit 720 may include at least one selected among a keypad, a keyboard, a display device, and so forth.

The memory device 730 may store data and/or commands to be executed by the controller 710. The memory device 730 may include a volatile memory device such as a DRAM and/or a nonvolatile memory device such as a flash memory. For example, a flash memory may be mounted to an information processing system such as a mobile terminal and a desktop computer. Such a flash memory may be configured by an SSD (solid state drive). In this case, the electronic system 700 may stably store a large amount of data in a flash memory system.

Such an electronic system 700 may further include an interface 740 for transmitting data to a communication network or receiving data from a communication network. The interface 740 may be a wired or wireless type. For example, the interface 740 may include an antenna or a wired/wireless transceiver.

Although not illustrated, the electronic system 700 may further include an application chipset, a camera image processor (CIP), and so forth.

The electronic system 700 may be realized as a mobile system, a personal computer, a computer for industrial use or a logic system which performs various functions. For example, the mobile system may be any one among a personal digital assistant (PDA), a portable computer, a web tablet, a mobile phone, a smart phone, a wireless phone, a laptop computer, a memory card, a digital music system and an information transmission/reception system.

In the case where the electronic system 700 is equipment capable of performing wireless communication, the electronic system 700 may be used in a communication system such as CDMA (code division multiple access), GSM (global system for mobile communication), NADC (North American digital cellular), E-TDMA (enhanced-time division multiple access), WCDMA (wideband code division multiple access), CDMA2000, LTE (long term evolution) and Wibro (wireless broadband Internet).

Figure 8:
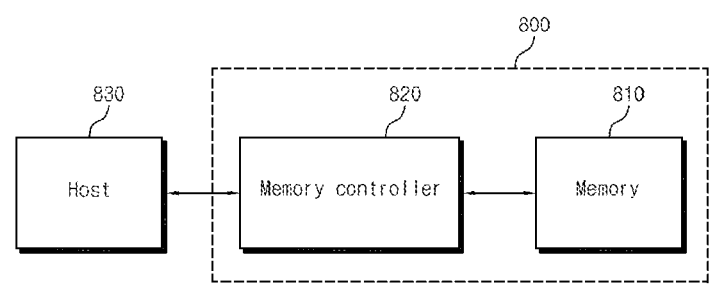
FIG. 8 is a block diagram representation of an example of a memory card including a semiconductor chip in accordance with embodiments.

Referring to FIG. 8, a memory card 800 may include the semiconductor chips in accordance with the various embodiments. For example, the memory card 800 may include a memory 810 and a memory controller 820. The memory 810 may include a nonvolatile memory device. The memory 810 and the memory controller 820 may store data or read stored data.

The memory 810 may include at least any one among nonvolatile memory devices to which the semiconductor chips in accordance with the embodiments are applied. The memory controller 820 may control the memory 810 to read stored data or store data, in response to a read/write request from a host 830.

While various embodiments have been described above, it will be understood to those skilled in the art that the embodiments described are by way of example only. Accordingly, the semiconductor chip and the stacked semiconductor chip using the same described herein should not be limited based on the described embodiments.

What is claimed is:

1. A semiconductor chip comprising:
   a semiconductor substrate having a front surface and a rear surface which faces away from the front surface;
   a fixed metal layer formed over the front surface of the semiconductor substrate, and having first metal lines which are formed in the fixed metal layer;
   a configurable metal layer formed over the fixed metal layer to have one surface which faces the fixed metal layer and an other surface which faces away from the one surface, and having second metal lines which are formed in the configurable metal layer such that at least one end of the second metal lines disposed on the one surface are respectively connected with the first metal lines and other ends of the second metal lines facing away from the at least one end are disposed at predetermined positions on the other surface; and
   external connection members formed over the other surface of the configurable metal layer including the second metal lines,
   wherein the second metal lines of the configurable metal layer are respectively coupled to the predetermined positions and are configured to connect all of the external connection members located at the predetermined positions to a respective first metal line,
   wherein all of the predetermined positions are respectively coupled to the external connection members when all the external connection members are microbumps; and only some of the predetermined positions, less than all of the predetermined positions, are coupled to the external connection members when all the external connection members are solder bumps; and
   wherein a diameter of each of the solder bumps is larger than a diameter of each of the microbumps.

2. The semiconductor chip according to claim 1, wherein the semiconductor substrate comprises a plurality of TSVs (through-silicon vias) which are formed to pass through the front surface and the rear surface of the semiconductor substrate, and are electrically connected with the first metal lines of the fixed metal layer.

3. The semiconductor chip according to claim 2, wherein the TSVs are formed to be respectively connected with the first metal lines which are arranged on the same vertical lines as the TSVs.

4. The semiconductor chip according to claim 1, wherein the fixed metal layer including the first metal lines has a multi-layered wiring line structure.

5. The semiconductor chip according to claim 1, further comprising:
   I/O buffers formed in the fixed metal layer to be electrically connected with some second metal lines of the configurable metal layer.

6. The semiconductor chip according to claim 5, further comprising:
   connection lines formed in the configurable metal layer to electrically connect the I/O buffers and the second metal lines.

7. The semiconductor chip according to claim 1, wherein, one group includes four first metal lines, the configurable metal layer is formed such that the second metal lines are connected with only first metal lines positioned first and third from a left end when viewed in a cross-section and respectively extend vertically.

8. The semiconductor chip according to claim 1, wherein, one group includes four first metal lines, the configurable metal layer is formed such that the second metal lines are connected with only first metal lines positioned first and third from a left end when viewed in a cross-section and extend to cross each other.

9. The semiconductor chip according to claim 1, wherein, one group includes four first metal lines, the configurable metal layer is formed such that two second metal lines are connected with first metal lines positioned first and second from a left end when viewed in a cross-section and extend to cross each other and the other two second metal lines are connected with first metal lines positioned third and fourth from the left end when viewed in the cross-section and extend to cross each other.

10. The semiconductor chip according to claim 1, wherein, one group includes four first metal lines, the configurable metal layer is formed such that three second metal lines have at least one end which are respectively connected with first metal lines positioned first, second and third from a left end when viewed in a cross-section and the other ends which are arranged on the same vertical lines as first metal lines positioned second, third and fourth, and that one second metal line connected at one end with the first metal line positioned fourth has the other end which is arranged on the same vertical line as the first metal line positioned first.

11. A semiconductor chip module comprising:

a semiconductor chip including a semiconductor substrate having a front surface and a rear surface which faces away from the front surface, a fixed metal layer formed over the front surface of the semiconductor substrate, and having first metal lines which are formed in the fixed metal layer, and a configurable metal layer formed over the fixed metal layer to have one surface which faces the fixed metal layer and an other surface which faces away from the one surface, and having second metal lines which are formed in the configurable metal layer such that at least one end of the second metal lines disposed on the one surface are respectively connected with the first metal lines and the other ends of the second metal lines facing away from the at least one end are disposed at predetermined positions on the other surface;

one or more additional semiconductor chips stacked over the semiconductor chip, and each having the same structure as the semiconductor chip; connection members interposed between the semiconductor chip and a lowermost additional semiconductor chip and between the one or more additional semiconductor chips, and physically and electrically connecting the semiconductor chip and the one or more additional semiconductor chips; and external connection members formed over the other surface of the configurable metal layer of the semiconductor chip, which includes the second metal lines, wherein the second metal lines of the configurable metal layer are respectively coupled to the predetermined positions and are configured to connect all of the external connection members located at the predetermined positions to a respective first metal line, wherein all of the predetermined positions are respectively coupled to the external connection members when all the external connection members are microbumps; and only some of the predetermined positions, less than all of the predetermined positions, are coupled to the external connection members when all the external connection members are solder bumps; and wherein a diameter of each of the solder bumps is larger than a diameter of each of the microbumps.

12. The semiconductor chip module according to claim 11, wherein each of semiconductor substrates of the semiconductor chip and the one or more additional semiconductor chips comprises a plurality of TSVs which are formed to pass through the front surface and the rear surface of the respective semiconductor substrates, and are electrically connected with the first metal lines of the fixed metal layer.

13. The semiconductor chip module according to claim 12, wherein the connection members are formed to electrically connect the TSVs of the semiconductor chip and the second metal lines of the lowermost additional semiconductor chip and electrically connect the TSVs of an underlying additional semiconductor chip and the second metal lines of an overlying additional semiconductor chip.

14. The semiconductor chip module according to claim 11, wherein the fixed metal layer has a multi-layered wiring line structure.

15. The semiconductor chip module according to claim 11, further comprising I/O buffers formed in the fixed metal layer to be electrically connected with some second metal lines of the configurable metal layer.

16. The semiconductor chip module according to claim 15, further comprising connection lines formed in the configurable metal layer to electrically connect the I/O buffers and the second metal lines.

\* \* \* \* \*